(12) United States Patent
Kuramori (10) Patent No.: US 7,528,641 B2
(45) Date of Patent: May 5, 2009

(54) DELAY CIRCUIT HAVING A CORRECTION CIRCUIT

(75) Inventor: Bunsho Kuramori, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 207 days.

(21) Appl. No.: 11/476,900

(22) Filed: Jun. 29, 2006

(65) Prior Publication Data
US 2007/0008022 A1    Jan. 11, 2007

(30) Foreign Application Priority Data

| Jun. 30, 2005 | (JP) | ............................ 2005-190964 |
| May 29, 2006 | (JP) | ............................ 2006-147587 |

(51) Int. Cl.
*H03H 11/26* (2006.01)

(52) U.S. Cl. ....................... 327/261; 327/264; 327/512

(58) Field of Classification Search ................ 327/261, 327/263, 264, 269, 270, 512, 513
See application file for complete search history.

(56) References Cited

U.S. PATENT DOCUMENTS

| 4,990,846 | A | * | 2/1991 | Buck et al. ................. 323/314 |
| 5,013,999 | A | * | 5/1991 | Yamada ...................... 323/313 |
| 5,453,709 | A | | 9/1995 | Tanimoto et al. |
| 5,461,331 | A | * | 10/1995 | Schorn ......................... 326/83 |
| 5,532,578 | A | * | 7/1996 | Lee ............................. 323/313 |
| 5,717,324 | A | * | 2/1998 | Tobita ......................... 323/313 |
| 5,812,000 | A | * | 9/1998 | Kobayashi et al. .......... 327/172 |
| 5,818,212 | A | * | 10/1998 | Min et al. .................... 323/314 |
| 5,994,937 | A | * | 11/1999 | Hara et al. .................. 327/262 |
| 6,489,836 | B2 | * | 12/2002 | Yeong ......................... 327/541 |

FOREIGN PATENT DOCUMENTS

| JP | 07-038394 | 2/1995 |
| JP | 09-214306 | 8/1997 |

* cited by examiner

*Primary Examiner*—An T Luu
(74) *Attorney, Agent, or Firm*—Studebaker & Brackett PC; Donald R. Studebaker (57) ABSTRACT

The present invention provides a delay circuit in which normal CMOS type inverters and modified inverters added with delay PMOSs on the power supply voltage VDD terminal side are alternately cascade-connected. A correction circuit that supplies a control signal to the gates of the delay PMOSs is provided in association with the delay circuit. The correction circuit comprises a PMOS diode-connected in the forward direction, and resistors that connect the drain of the PMOS to the ground voltage VSS terminal side. The correction circuit outputs the control signal from an internal node provided between the resistors. Thus, when a power supply voltage rises, the voltage of the control signal also rises. Hence, gate-to-source voltages of the delay PMOSs are kept constant, and drain currents remain unchanged and a delay time is kept constant as well.

9 Claims, 4 Drawing Sheets

PRIOR ART

DELAY CIRCUIT HAVING A CORRECTION CIRCUIT

BACKGROUND OF THE INVENTION

1. Field of the Invention

The present invention relates to compensation for a variation in power supply voltage and a variation in temperature in a delay circuit.

This application is counterparts of Japanese patent applications, Serial Number 190964/2005, filed on Jun. 30, 2005 and 147587/2006, filed on May 29, 2006, the subject matter of which are incorporated herein by reference.

2. Description of the Related Art

As delay circuits for signal delay, each configured using a plurality of stages of inverters, there have heretofore been known ones described in, for example, patent documents 1 and 2 (Japanese Laid Open Patent Application No. Hei 7 (1995)-38394 and Japanese Laid Open Patent Application No. Hei 9 (1997)-214306)

Figure 2:
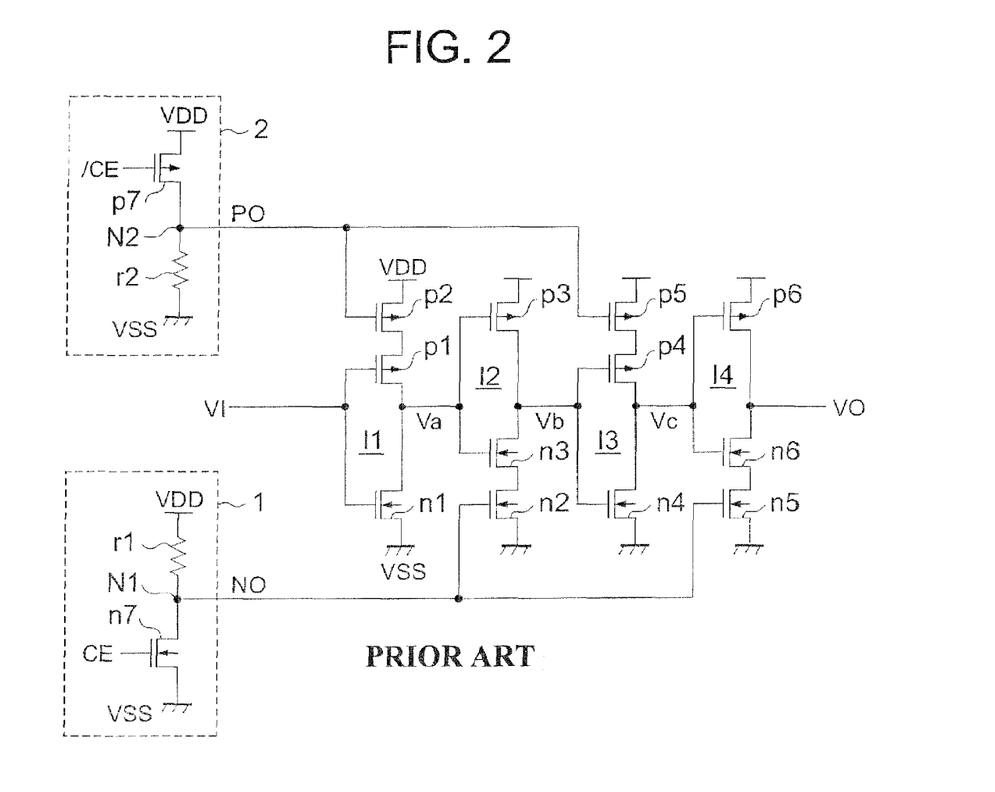
FIG. 2 is a circuit diagram of a conventional delay circuit.

FIG. 2 is a circuit diagram showing a configurational example of the conventional delay circuit described in the patent document 1.

The delay circuit shown in FIG. 2 is a circuit which, when an input signal VI is transitioned from a high level (hereinafter called "H" level) to a low level (hereinafter called "L" level), produces or forms a desired delay time and outputs an output signal VO therefrom. The present delay circuit comprises inverter circuits of four stages which comprise P channel MOS transistors (hereinafter called "PMOSs") and N channel MOS transistors (hereinafter called "NMOSs") and which delay the input signal VI and output an output signal VO, a correction circuit 1 which supplies a control signal NO for delay time correction to the NMOSs constituting the inverter circuits of four stages, and a correction circuit 2 which supplies a control signal NO for delay time correction to the PMOSs constituting the inverter circuits of four stages.

The inverter circuits of four stages comprise a modified inverter I1 corresponding to a first stage which outputs a signal Va obtained by inverting and delaying an input signal VI, a modified inverter I2 corresponding to a second stage which outputs a signal Vb obtained by inverting and delaying the signal Va, a modified inverter I3 corresponding to a third stage which outputs a signal Vc obtained by inverting and delaying the signal Vb, and a modified inverter I4 corresponding to a fourth stage which outputs an output signal VO obtained by inverting and delaying the signal Vc.

The first-stage modified inverter I1 has a PMOS p2 whose gate electrode (hereinafter called simply "gate") is controlled by a control signal PO outputted from the correction circuit 2, a PMOS p1 whose gate is controlled by the input signal VI, and an NMOS n1 of which the gate is controlled by the input signal VI. Respective source electrodes (hereinafter called simply "sources") of the these PMOSs p2 and p1 and NMOS n1 and respective drain electrodes (hereinafter called simply "drains") thereof are respectively connected in series between a power supply terminal (hereinafter called "VDD terminal") to which a power supply voltage VDD is applied, and a ground terminal (hereinafter called "VSS terminal") to which a ground voltage VSS is applied.

The second-stage modified inverter I2 has a PMOS p3 of which the gate is controlled by the signal Va, an NMOS n3 whose gate is controlled by the signal Va, and an NMOS n2 whose gate is controlled by the control signal NO outputted from the correction circuit 1. The sources and drains of these PMOS p3 and NMOSs n3 and n2 are series-connected between the VDD terminal and the VSS terminal.

The third-stage modified inverter I3 has a PMOS p5 whose gate is controlled by the control signal PO, a PMOS p4 whose gate is controlled by the signal Vb, and an NMOS n4 whose gate is controlled by the signal Vb. The respective sources and drains of these PMOSs p5 and p4 and NMOS n4 are connected in series between the VDD terminal and the VSS terminal.

The fourth-stage modified inverter I4 has a PMOS p6 whose gate is controlled by the signal Vc, an NMOS n6 whose gate is controlled by the signal Vc, and an NMOS n5 whose gate is controlled by the control signal NO. The respective sources and drains of these PMOS p6 and NMOSs n6 and n5 are connected in series between the VDD terminal and the VSS terminal.

The correction circuit 1 has a resistor r1, an internal node N1 used to output the control signal NO, and an NMOS n7 whose gate is controlled by a signal CE. These resistor r1, internal node N1 and NMOS n7 are connected in series between the VDD terminal and the VSS terminal. The signal CE supplied to the gate of the NMOS n7 serves as the power supply voltage VDD during operation and serves as the ground voltage VSS at standby.

The correction circuit 2 has a PMOS p7 whose gate is controlled by a signal /CE, an internal node N2 used to output the control signal PO, and a resistor r2. These PMOS p7, internal node N2 and resistor r2 are connected in series between the VDD terminal and the VSS terminal. The signal /CE supplied to the gate of the PMOS p7 serves as the ground voltage VSS during operation and serves as the power supply voltage VDD at standby.

The operation of the delay circuit shown in FIG. 2 will next be explained.

When the input signal VI falls from an "H" level to an "L" level, the respective input signals Va and Vc of the modified inverters I2 and I4 are respectively transitioned from an "L" level to an "H" level. At this time, the dimensions of the NMOSs n2 and n5 and the voltage of the control signal NO of the correction circuit 1 are set in such a manner that the values of currents that the modified inverters I2 and I4 supply to the VSS terminal side are respectively determined by the NMOS n2 and the NMOS n5.

When the threshold voltage Vtn of each NMOS is reduced due to a process variation, the voltage of the control signal NO of the correction circuit 1 is lowered. Therefore, the effect of decreasing an on resistance value by the reduction in the threshold voltage Vtn of each of the NMOSs n2 and n5 and the effect of increasing an on resistance value by a reduction in gate voltage of each NMOS are cancelled out. Hence, there is little difference between delay times of the modified inverters I2 and I4 as compared with the case in which the threshold voltage Vtn is of a standard value. When the threshold voltage Vtn of each NMOS is large, the effect of increasing an on resistance value by the increase in the threshold voltage Vtn of each of the NMOSs n2 and n5, and the effect of decreasing an on resistance value by a rise in gate voltage of each NMOS are cancelled out. Hence, there is little difference between the delay times as compared with the case in which the threshold voltage Vtn is of a standard value. Consequentially, even though the threshold voltage Vtn of each NMOS varies depending upon the process variation, the difference in delay time little occurs between the modified inverters I2 and I4.

When the ambient temperature is low, the effect of decreasing on resistance values of the NMOSs n2 and n5 and the effect of increasing their on resistance values by a reduction in the voltage of the control signal NO are cancelled out. When the ambient temperature is high, the effect of increasing the on resistance values of the NMOSs n2 and n5 and the effect of decreasing their on resistance values by an increase in the voltage of the control signal NO are cancelled out. As a result, there is little difference in delay time between the modified inverters I2 and I4 where the ambient temperature is low and high.

Further, since the modified inverter I1 and the modified inverter I3 also generate effects similar to the modified inverters I2 and I4 by means of the correction circuit 2, there is little difference in delay time due to the process variation and the variation in ambient temperature.

Thus, the conventional delay circuit shown in FIG. 2 compensates for a variation in delay time due to the process variation and the variation in ambient temperature and obtains a predetermined delay time at all times.

However, such a conventional delay circuit as shown in FIG. 2 is accompanied by a problem that although the variation in delay time due to the process variation and the variation in ambient temperature is compensated for, the delay time also varies when the power supply voltage VDD varies.

SUMMARY OF THE INVENTION

The present invention has been made in view of the above problems. It is an object of the present invention to provide a method for manufacturing a semiconductor device, which prevents the occurrence of a charge escape in the vicinity of an edge portion of a floating gate without changing a desired capacitance of the floating gate to thereby avoid degradation in electric characteristic.

The present invention aims to provide a delay circuit capable of compensating for a variation in delay time due to a process variation and a variation in power supply voltage.

According to one aspect of the present invention, for attaining the above object, there is provided a delay circuit that comprises modified inverters and a correction circuit.

Each of the modified inverters has first and second MOS transistors of first conduction type connected in series between a first power supply terminal to which a first power supply voltage is applied and an output node, and a third MOS transistor of second conduction type connected between the output node and a second power supply terminal to which a second power supply voltage is applied. Each of gate electrodes of the first and third MOS transistors is connected to an input node. A gate electrode of the second MOS transistor is supplied with a control signal for delay control. Further, the correction circuit has a fourth MOS transistor of the first conduction type and a first resistor both connected in series between the first power supply terminal and an internal node used for outputting the control signal, and a second resistor connected between the internal node and the second power supply terminal. The fourth MOS transistor is diode-connected in a forward direction.

According to the delay circuit of the present invention, it is configured in such a manner that a voltage reduced by a threshold voltage is generated from the first power supply voltage by the fourth MOS transistor diode-connected in the forward direction, the voltage is divided by the first and second resistors to generate a control signal, and the gate of the delay second MOS transistor is controlled by the control signal. Thus, when, for example, the first power supply voltage rises, the voltage of the control signal also rises, whereby a gate-to-source voltage of the second MOS transistor is kept approximately constant. Accordingly, the delay circuit brings about an advantageous effect in that the on resistance value of the second MOS transistor is held approximately constant and no delay time changes.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 7(A), (B), (C) and (D) are waveform diagrams showing simulation results of the fourth embodiment of the present invention.

DETAILED DESCRIPTION OF THE PREFERRED EMBODIMENTS

Preferred embodiments of the present invention will hereinafter be described with reference to the accompanying drawings. Incidentally, the drawings merely schematically show the shape, size and positional relationships of respective components to such a degree that the present invention can be understood. Thus, the present invention is not limited in particular. Incidentally, although specific materials, conditions and numerical conditions or the like might be used in the following description, they are simply preferred examples. Thus, no limitations are imposed on them. It is to be understood that similar components illustrated in the respective drawings used for the following description are respectively identified by the same reference numerals, and the description of certain common components might be omitted.

A preferred embodiment of the present invention will hereinafter be described with reference to the accompanying drawings. Incidentally, the shape, size and physical relationship of each constituent element or component in the figures are merely approximate illustrations to enable an understanding of the present invention. Therefore, the present invention is not limited only to examples illustrated in particular.

Although the specific materials, conditions and numeral conditions or the like might be used in the following description, these are no more than one of preferred examples. Therefore, the present invention is by no means limited by or to these.

Further, be cognizant of the fact that similar constituent elements illustrated in the respective figures used in the following description are given the same reference numerals, and their dual explanations might be omitted.

A delay circuit is provided with modified inverters and a correction circuit.

Each of the modified inverters has first and second PMOSs series-connected between a VDD terminal and an output node, and a third NMOS connected between the output node and a VSS terminal. The gate of each of the first PMOS and the third NMOS is connected to its corresponding input node, and the gate of the second PMOS is supplied with a control signal for delay control. Further, the correction circuit has a fourth PMOS and a first resistor connected in series between the VDD terminal and an internal node for outputting the control signal, and a second resistor connected between the internal node and the VSS terminal. The fourth PMOS is diode-connected in the forward direction.

First Preferred Embodiment

Configuration of First Embodiment

Figure 1:
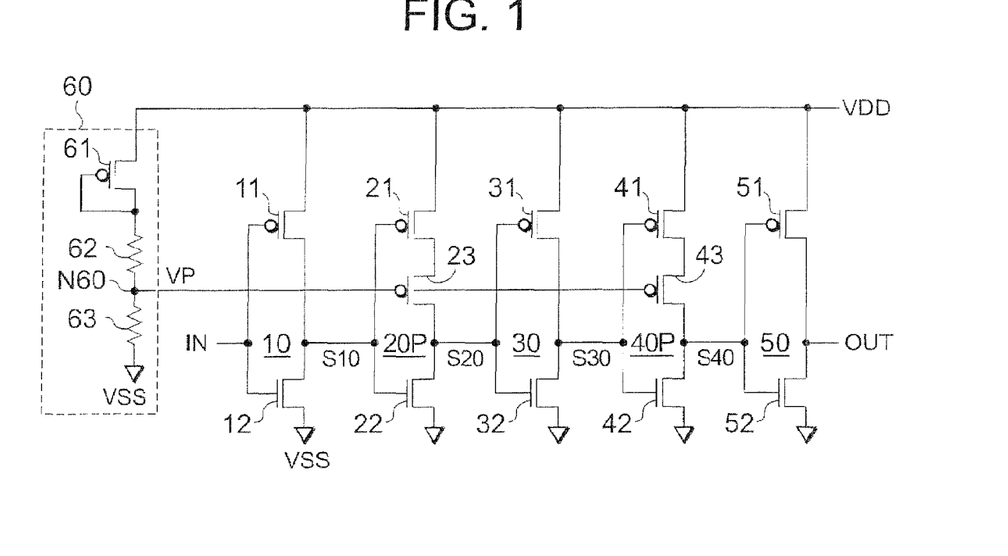
FIG. 1 is a circuit diagram of a delay circuit showing a first embodiment of the present invention.

FIG. 1 is a circuit diagram of a delay circuit showing a first embodiment of the present invention.

The delay circuit shown in FIG. 1 is a circuit that is used in a control circuit of a memory and generates a timing control signal having a predetermined pulse width from a pulse signal narrow in width generated upon switching of address signals. The delay circuit comprises inverter circuits of five stages which, when an input signal IN is transitioned from an "L" level to an "H" level, makes desired delay times and outputs an output signal OUT, and a correction circuit 60 which supplies a delay time correcting control signal VP to the inverter circuits of the five stages.

The inverter circuits of five stages comprise an inverter 10 corresponding to a first stage which outputs a signal S10 obtained by inverting an input signal IN inputted from an input node and delaying the same from an output node thereof, a modified inverter 20P corresponding to a second stage which outputs a signal S20 obtained by inverting and delaying the signal S10 inputted from its input node from an output node thereof, an inverter 30 corresponding to a third stage which outputs a signal S30 obtained by inverting and delaying the signal S20 inputted from its input node from an output node thereof, a modified inverter 40P corresponding to a fourth stage which outputs a signal S40 obtained by inverting and delaying the signal S30 inputted from its input node from an output node thereof, and an inverter 50 corresponding to a fifth stage which outputs an output signal OUT obtained by inverting and delaying the signal S40 inputted from its input node from an output terminal thereof.

The inverters 10, 30 and 50 corresponding to the first, third and fifth stages are normal CMOS type inverters. Of these, the first-stage inverter 10 has a first conduction type MOS transistor (e.g., PMOS) 11, and a second conduction type MOS transistor (e.g., NMOS) 12. These PMOS 11 and NMOS 12 are connected in series between a first power supply terminal (e.g., VDD terminal) to which a first power supply voltage (e.g., power supply voltage VDD) is applied, and a second power supply terminal (e.g., VSS terminal) to which a second power supply voltage (e.g., ground voltage VSS) is applied. The input signal IN is inputted to the input node placed on the gate side of each of the PMOS 11 and NMOS 12, whereas the signal S10 is outputted from the corresponding output node on the drain side of each of the PMOS 11 and NMOS 12.

Likewise, the third-stage inverter 30 has a PMOS 31 and an NMOS 32. These PMOS 31 and NMOS 32 are connected in series between the VDD terminal and the VSS terminal. The signal S20 is inputted to the corresponding input node on the gate side of each of the PMOS 31 and NMOS 32, whereas the signal S30 is outputted from the corresponding output node on the drain side of each of the PMOS 31 and NMOS 32. The fifth-stage inverter 50 has a PMOS 51 and an NMOS 52. These PMOS 51 and NMOS 52 are connected in series between the VDD terminal and the VSS terminal. The signal S40 is inputted to the corresponding input node on the gate side of each of the PMOS 51 and NMOS 52, whereas the output signal OUT is outputted from the output terminal on the drain side of each of the PMOS 51 and NMOS 52.

The modified inverters 20P and 40P of the second and fourth stages are respectively inverters that normally combine CMOS inverters with delay MOS transistors. Of these, the second-stage modified inverter 20P has first conduction type first and second MOS transistors (e.g., PMOSs) 21 and 23 and a second conduction type MOS transistor (e.g., NMOS) 22. These PMOSs 21 and 23 and NMOS 22 are connected in series between the first power supply terminal (e.g., VDD terminal) and the second power supply terminal (e.g., VSS terminal). The signal S10 is inputted to the corresponding input node on the gate side of each of the PMOS 21 and NMOS 22. The signal S20 is outputted from the corresponding output node on the drain side of each of the PMOS 21 and NMOS 22. The control signal VP is supplied to the gate of the PMOS 23.

Likewise, the fourth-stage modified inverter 40P has PMOSs 41 and 43 and an NMOS 42. These PMOSs 41 and 43 and the NMOS 42 are connected in series between the VDD terminal and the VSS terminal. The signal S30 is inputted to the corresponding input node on the gate side of each of the PMOS 41 and NMOS 42. The signal S40 is outputted from the corresponding output node on the drain side of each of the PMOS 41 and NMOS 42. The control signal VP is supplied to the gate of the PMOS 43.

The correction circuit 60 has a first conduction type fourth MOS transistor (e.g., PMOS 61) diode-connected in the forward direction, a first resistor 62, an internal node N60 used for outputting the control signal VP, and a second resistor 63. The source of the PMOS 61 is connected to the first power supply terminal (e.g., VDD terminal) and the gate and drain thereof are connected to one end of the first resistor 62. The other end of the first resistor 62 is connected to the internal node N60 and one end of the second resistor 63, and the other end of the second resistor 63 is connected to the second power supply terminal (e.g., VSS terminal).

Operation of First Embodiment

Schematic operations of the inverter circuits of five stages shown in FIG. 1 will first be explained.

When the input signal IN is of an "L" level, the output signal S10 of the first-stage inverter 10 is brought to an "H" level and supplied to the gates of the PMOS 21 and NMOS 22 each corresponding to the input node of the second-stage modified inverter 20P. Thus, the PMOS 21 is brought to an off state and the NMOS 22 is brought to an on state, whereby the output signal S20 of the modified inverter 20P is brought to an "L" level.

When the input signal IN is now transitioned from the "L" level to the "H" level, the output signal S10 of the inverter 10 is brought to an "L" level, so that the PMOS 21 of the modified inverter 20P is brought to an on state and the NMOS 22 thereof is brought to an off state. Thus, the output node of the modified inverter 20P is connected to the VDD terminal via the PMOSs 21 and 23. Since, however, the output node of the modified inverter 20P is charged through the delay PMOS 23, the output signal S20 is not brought to an H" level immediately but to the "H" level after a predetermined delay time has elapsed.

Such a delay occurs in like manner even in the case of the fourth-stage modified inverter 40P. The output signal S40 of the modified inverter 40P is inverted and waveform-shaped by the fifth-stage inverter 50, which in turn is outputted as an output signal OUT. Thus, when the input signal IN is transitioned from the "H" level to the "L" level, such an output signal OUT as to be transitioned from the "L" level to the "H" level immediately is obtained, whereas when the input signal IN is transitioned from the "L" level to the "H" level, such an output signal OUT as to be transitioned from the "H" level to the "L" level after elapse of a predetermined time is obtained.

Compensation for a variation in delay time by the correction circuit 60 will next be explained.

Assuming that the threshold voltage of the PMOS 61 is Vtp and the resistance values of the resistors 62 and 63 are respectively R62 and R63, the voltage of the control signal VP outputted from the correction circuit 60 is given as expressed in the following equation. Thus, the voltage of the control signal VP varies substantially in proportion to the power supply voltage VDD.

$$VP=(VDD-Vtp)\times R63/(R62+R63)$$

Since the voltages applied to the gates of the delay PMOSs 23 and 43 in the modified inverters 20P and 40P also rise where the power supply voltage VDD rises, gate-to-source voltages Vgs of these PMOSs 23 and 43 are kept substantially constant and hence drain currents Ids can be rendered constant. When the power supply voltage VDD is lowered, the gate voltages of the PMOSs 23 and 43 are also reduced and the gate-to-source voltages Vgs are kept substantially constant. Hence, the drain currents Ids are kept constant. It is thus possible to suppress the variation in delay time with respect to a variation in power supply voltage VDD.

Since the voltage of the control signal VP outputted from the correction circuit 60 becomes high where the threshold voltage Vtp of each PMOS is reduced due to a process variation, the effect of decreasing an on resistance value due to a reduction in the threshold voltage Vtp of each of the PMOSs 23 and 43, and the effect of increasing an on resistance value due to a rise in the gate voltage of each of them are cancelled out. Further, there is little difference between the delay times of the modified inverters 20P and 40P as compared with the case in which each of the threshold voltages Vtp is of a standard value. When the threshold value Vtp is large, the effect of increasing an on resistance value due to an increase in the threshold voltage Vtp of each of the PMOSs 23 and 43 and the effect of decreasing an on resistance value due to a reduction in the gate voltage of each of the PMOSs 23 and 43 are cancelled out. Further, there is little difference between the delay times as compared with the case in which each of the threshold voltages Vtp is of a standard value. Thus, even though the threshold voltage Vtp varies depending upon the process variation, there is litter difference between the delay times.

Effects of First Embodiment

Although, for example, the conventional delay circuit shown in FIG. 2 cannot assure or guarantee a pulse width with respect to a variation in power supply voltage VDD, the first embodiment is capable of solving it and assuring the pulse width. Its reason or the like will be explained below.

Figure 3:
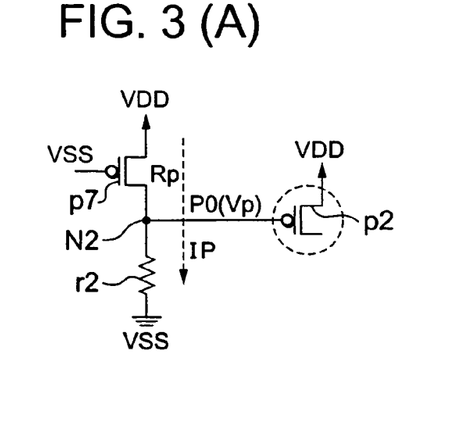
FIGS. 3(A) and 3(B) are diagrams showing the reason why a pulse width with respect to a variation in power supply voltage cannot be guaranteed in the conventional delay circuit.

(I) The reason that the pulse width cannot be guaranteed with respect to the variation in the power supply voltage VDD in the conventional delay circuit shown in FIG. 2:

FIGS. 3(*a*) and 3(*b*) are diagrams showing the reason why the pulse width cannot be guaranteed with respect to the variation in the power supply voltage VDD in the conventional delay circuit, wherein the same figure (a) is a circuit diagram of a PMOS type showing an essential part of FIG. 2, and the same figure (b) is a circuit diagram of an NMOS type showing an essential part of FIG. 2.

(I-I): PMOS Type

Assuming that an on resistance of a PMOS p7 shown in FIG. 3(*a*) is Rp, the current that flows through the circuit is Ip, and the voltage of a control signal PO is Vp, the following equations are established:

$$Ip(Rp+r2)=VDD$$

$$VDD-Vp=Ip*Rp$$

Solving the above about the control voltage Vp yields the following equation:

$$Vp=r2*VDD/(r2+Rp)$$

A delay width becomes constant in the following manner by keeping constant, for example, a gate-to-source voltage Vgs of a PMOS p2 corresponding to a delay element.

$$VDD-Vp=\text{constant}(\alpha)$$

Therefore, it results in a desired voltage (VDD−Vp) as follows:

$$VDD-Vp=Rp*VDD/(r2+Rp)$$

If the on resistance Rp satisfies the following equation (1) with respect to the power supply voltage VDD, then a voltage guarantee is enabled.

$$Rp=\alpha*r2/(VDD-\alpha) \qquad (1)$$

where α=gate-to-source voltage Vgs of PMOS p2 corresponding to delay element=constant value In the PMOS p7 brought to on resistance in the circuit shown in FIG. 3(*a*), the following equation is established and an unsaturated region is reached.

$$Vds<Vgs-Vt(Vp>Vt)$$

At this time, the following equation is established as the current Ip that flows through the PMOS p7:

$$Ip=\beta*[(Vgs-Vt)-0.5*Vds]*Vds$$

The on resistance Rp of the PMOS p2 can be expressed in the following equation:

$$Rp=(VDD-Vp)/Ip=2/(VDD-2Vt+Vp)*\beta$$

If the following equation is established when 2/β=α*r2:

$$\alpha=2Vt-Vp,$$

the equation (1) is satisfied. Since, however, the control voltage Vp is of a voltage that depends upon the power supply voltage VDD, then the following equation is not established.

$$\alpha=2Vt-Vp$$

Thus, it can be demonstrated that the equation (1) is not established either and the voltage guarantee cannot be ensured in the circuit shown in FIG. 3(*a*).

(I-2): NMOS Type

Assuming that the on resistance of an NMOS n7 shown in FIG. 3(*b*) is Rn, the current that flows through the circuit is In, and the voltage of a control signal NO is Vn, the following equations are established:

$$In(Rn+r1)=VDD$$

$$VDD-Vn=In*r1$$

Solving the above equations about the control voltage Vn yields the following equation:

$$Vn=Rn*VDD/(r1+Rn)$$

A delay width becomes constant in the following manner by keeping constant, for example, a gate-to-source voltage Vgs of an NMOS n2 corresponding to a delay element. Therefore, it is desirable to set Vn in the following manner.

$$Vn = \text{constant}(\alpha)$$

If the on resistance Rn satisfies the following equation (2) with respect to the power supply voltage VDD, then a voltage guarantee is enabled.

$$Rn = \alpha * r1/(VDD - \alpha) \qquad (2)$$

where α=gate-to-source voltage Vgs of NMOS n2 corresponding to delay element=constant value=Vn In the NMOS n7 brought to on resistance in the circuit shown in FIG. 3(b), the following equation is established and an unsaturated region is reached.

$$Vds < Vgs - Vt(Vn > Vt)$$

At this time, the following equation is established as the current In that flows through the NMOS n7:

$$In = \beta * [(Vgs - Vt) - 0.5 * Vds] * Vds$$

The on resistance Rn of the NMOS n7 is expressed in the following equation:

$$Rn = Vn/In = 1/(VDD - Vt - 0.5 * Vn)/\beta$$

$$1/\beta = \alpha * r1$$

If the following equation is established in the equations referred to above, then the equation (2) is satisfied.

$$\alpha = Vt + 0.5 Vn$$

Since Vn=α in the above equation, a voltage guarantee is made possible if the following equation (3) is established.

$$\alpha = Vn = 2Vt$$

$$r1 = 1/(2Vt * \beta) \qquad (3)$$

However, r1 is a resistive element and hence only its resistance value at a given threshold voltage Vt can provide equality. That is, the resistance cannot be changed corresponding to a variation in threshold voltage Vt dependent on the temperature. Thus, it can be demonstrated that when even the dependence of temperature is taken into consideration, the equation (3) is not established and the voltage guarantee cannot be carried out.

It can be demonstrated that the voltage guarantee cannot be carried out in the PMOS type in the conventional delay circuit as described above. It was further possible to demonstrate that the voltage guarantee and the temperature compensation were incompatible. The first embodiment is capable of solving such a conventional problem and brings about the following advantageous effects.

(II) Effects of First Embodiment

According to the delay circuit of the first embodiment, it is provided with the correction circuit 60 which generates the voltage (VDD−Vtp) by the diode-connected PMOS 61 and divides the voltage by the resistors 62 and 63 to generate the control signal VP, and the modified inverters 20P and 40P respectively having the delay PMOSs 23 and 43 whose gates are controlled by the control signal VP. Therefore, it is possible to suppress variations in delay time due to the process variation and the variation in the power supply voltage VDD and assure the pulse width.

Modifications of First Embodiment

The first embodiment is not limited to such a circuit configuration as shown in FIG. 1 and other usage forms and modifications are allowed. As the modifications thereof, for example, the following (i) through (iv) are known.

(i) The number of stages of the inverter circuits shown in FIG. 1 is not limited to five. At least one modified inverter may be provided.

(ii) While the normal CMOS type inverter 10 is provided as the first stage, a desired delay time is made and an output signal OUT can be outputted when an input signal IN is transitioned from an "H" level to an "L" level if the present inverter 10 is omitted and the modified inverter 20 is supplied with the input signal IN.

(iii) The delay PMOSs 23 and 43 may be respectively provided between the PMOSs 21 and 41 and the VDD terminal without being provided between the PMOSs 21 and 41 and the output nodes.

(iv) In the correction circuit 60, the order in which the PMOS 61 and the resistor 62 are connected may be taken in reverse.

Second Preferred Embodiment

Configuration of Second Embodiment

Figure 4:
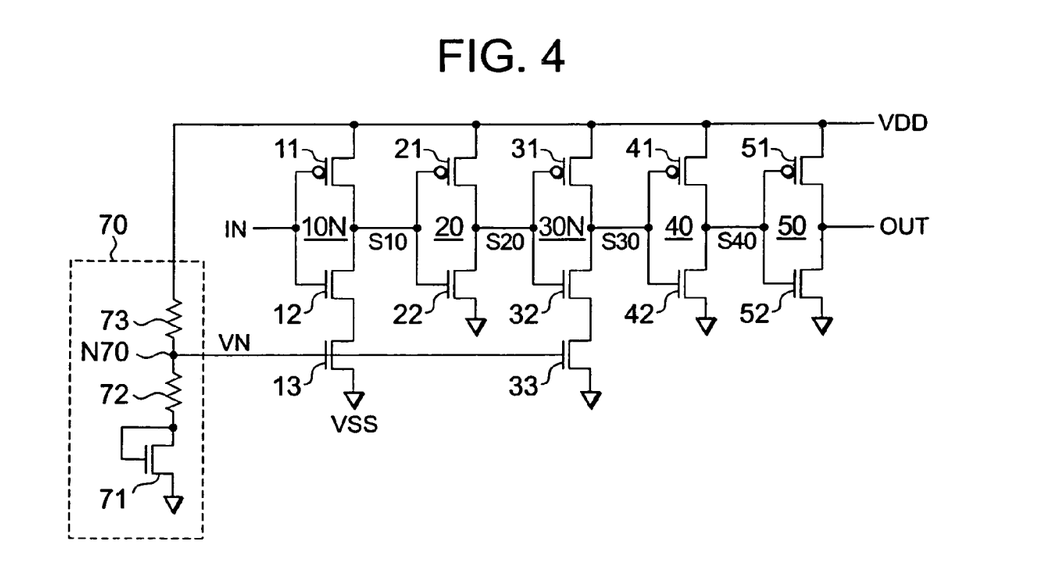
FIG. 4 is a circuit diagram of a delay circuit showing a second embodiment of the present invention.

FIG. 4 is a circuit diagram of a delay circuit showing a second embodiment of the present invention. Elements common to those shown in FIG. 1 illustrative of the first embodiment are given common reference numerals.

In a manner similar to FIG. 1, the delay circuit shown in FIG. 4 is a circuit that generates a timing control signal having a predetermined pulse width from a pulse signal narrow in width generated upon switching of address signals. The delay circuit comprises inverter circuits of five stages which, when an input signal IN is transitioned from an "L" level to an "H" level, makes desired delay times and outputs an output signal OUT, and a correction circuit 70 which supplies a delay time correcting control signal VN to the inverter circuits of the five stages.

The inverter circuits of five stages comprise a modified inverter 10N corresponding to a first stage which outputs a signal S10 obtained by inverting an input signal IN inputted from an input node and delaying the same from an output node thereof, an inverter 20 corresponding to a second stage which outputs a signal S20 obtained by inverting and delaying the signal S10 inputted from its input node from an output node thereof, a modified inverter 30N corresponding to a third stage which outputs a signal S30 obtained by inverting and delaying the signal S20 inputted from its input node from an output node thereof, an inverter 40 corresponding to a fourth stage which outputs a signal S40 obtained by inverting and delaying the signal S30 inputted from its input node from an output node thereof, and an inverter 50 corresponding to a fifth stage which outputs an output signal OUT obtained by inverting and delaying the signal S40 inputted from its input node from an output terminal thereof.

The modified inverters 10P and 30P corresponding to the first and third stages are respectively inverters in which normal CMOS inverters are combined with delay MOS transistors. Of these, the first-stage modified inverter 10N has a first conduction type first MOS transistor (e.g., PMOS) 11, and second conduction type second and third MOS transistor (e.g., NMOSs) 12 and 13. These PMOS 11 and NMOSs 12 and 13 are connected in series between a first power supply terminal (e.g., VDD terminal) and a second power supply terminal (e.g., VSS terminal). The input signal IN is inputted to the input node provided on the gate side of each of the PMOS 11 and NMOS 12, whereas the signal S10 is outputted from the corresponding output node on the drain side of each of the PMOS 11 and NMOS 12. The gate of the NMOS 13 is supplied with the control signal VN.

Likewise, the third-stage modified inverter 30N has a PMOS 31 and NMOSs 32 and 33. These PMOS 31 and NMOSs 32 and 33 are connected in series between the VDD terminal and the VSS terminal. The signal S20 is inputted to the corresponding input node on the gate side of each of the PMOS 31 and NMOS 32, whereas the signal S30 is outputted from the corresponding output node on the drain side of each of the PMOS 31 and NMOS 32. The gate of the NMOS 33 is supplied with the control signal VN.

The inverters 20, 40 and 50 of the second, fourth and fifth stages are respectively normal CMOS type inverters. Of these, the second-stage inverter 20 has a first conduction type MOS transistor (e.g., PMOS) 21 and a second conduction type MOS transistor (e.g., NMOS) 22. These PMOS 21 and NMOS 22 are connected in series between the first power supply terminal (e.g., VDD terminal) to which a first power supply voltage (e.g., power supply voltage VDD) is applied, and the second power supply terminal (e.g., VSS terminal) to which a second power supply voltage (e.g., ground voltage VSS) is applied. The signal S10 is inputted to the corresponding input node on the gate side of each of the PMOS 21 and NMOS 22. The signal S20 is outputted from the corresponding output node on the drain side of each of the PMOS 21 and NMOS 22.

Likewise, the fourth-stage inverter 40 has a PMOS 41 and an NMOS 42. These PMOS 41 and NMOS 42 are connected in series between the VDD terminal and the VSS terminal. The signal S30 is inputted to the corresponding input node on the gate side of each of the PMOS 41 and NMOS 42. The signal S40 is outputted from the corresponding output node on the drain side of each of the PMOS 41 and NMOS 42. The fifth-stage inverter 50 has a PMOS 51 and an NMOS 52. These PMOS 51 and NMOS 52 are series-connected between the VDD terminal and the VSS terminal. The signal S40 is inputted to the corresponding input node on the gate side of each of the PMOS 51 and NMOS 52. The output signal OUT is outputted from the corresponding output terminal on the drain side of each of the PMOS 51 and NMOS 52.

The correction circuit 70 has a first resistor 73, an internal node N70 used to output the control signal VN, a second resistor 72, and a second conduction type fourth MOS transistor (e.g., NMOS 71) diode-connected in the forward direction. The first resistor 73 is connected between the first power supply terminal (e.g., VDD terminal) and the internal node N70. One end of the second resistor 72 is connected to the internal node N70. The other end of the second resistor 72 is connected to the drain and gate of the NMOS 71, and the source of the NMOS 71 is connected to the second power supply terminal (e.g., VSS terminal).

Operation of Second Embodiment

Schematic operations of the inverter circuits of five stages shown in FIG. 4 will first be explained.

When the input signal IN is of an "L" level, the PMOS 11 of the first-stage modified inverter 10N is brought to an on state and the NMOS 12 thereof is brought to an off state. Hence, the output signal S10 of the modified inverter 10N is "H" in level. When the input signal IN is transitioned from the "L" to "H" levels here, the PMOS 11 is held in the off state and the NMOS 12 is held in the on state. Thus, the output node of the modified inverter 10N is connected to the VSS terminal via the NMOSs 12 and 13. Since, however, the output node of the modified inverter 10N is discharged via the delay NMOS 13, the output signal S10 is not brought to an "L" level immediately but to the "L" level after the elapse of a predetermined delay time.

Such a delay occurs in like manner even in the case of the third-stage modified inverter 30N. The output signal S30 of the modified inverter 30N is waveform-shaped by the fourth-stage and fifth-stage inverters 40 and 50, which in turn is outputted as an output signal OUT. Thus, when the input signal IN is transitioned from the "H" level to the "L" level, such an output signal OUT as to be transitioned from the "L" level to the "H" level immediately is obtained, whereas when the input signal IN is transitioned from the "L" level to the "H" level, such an output signal OUT as to be transitioned from the "H" level to the "L" level after elapse of a predetermined time is obtained.

Compensation for a variation in delay time by the correction circuit 70 will next be explained.

Assuming that the threshold voltage of the NMOS 71 is Vtn and the resistance values of the resistors 72 and 73 are respectively R72 and R73, the voltage of the control signal VN outputted from the correction circuit 70 is given as expressed in the following equation.

$$VN = (VDD \times R72 + Vtn \times R73)/(R72 + R73)$$

Accordingly, the voltage of the control signal VN varies depending upon the power supply voltage VDD. However, the resistance value R72 of the resistor 72 is set small and the resistance value R73 of the resistor 73 is set large, whereby the dependence of the control signal VN on the power supply voltage VDD can be reduced and the dependence on the threshold voltage Vtn can be enhanced.

Thus, the voltages applied to the gates of the delay NMOSs 13 and 33 in the modified inverters 10N and 30N are brought to a rise smaller than the width of a rise in the power supply voltage VDD where the power supply voltage VDD rises. Hence, gate-to-source voltages Vgs of these NMOSs 13 and 33 are kept constant to some degree and drain currents Ids can be rendered approximately constant. When the power supply voltage VDD is lowered, the gate voltages of the NMOSs 13 and 33 are also reduced and the gate-to-source voltages Vgs are kept constant to some extent. Hence, the drain currents Ids are kept approximately constant. It is thus possible to suppress the variation in delay time with respect to a variation in power supply voltage VDD.

Incidentally, the influence of the threshold voltage Vtn of the NMOS due to a process variation is also cancelled by adverse effects respectively produced by the NMOS 71 lying in the correction circuit 70 and the delay NMOSs 13 and 33 as described in the first embodiment. Hence, there is little difference between delay times.

Effects of Second Embodiment

According to the delay circuit of the second embodiment, it is provided with the correction circuit 70 which generates the control signal VN corresponding to the power supply voltage VDD and the threshold voltage Vtn by the diode-connected NMOS 71 and the resistors 72 and 73 for division, and the modified inverters 10N and 30N respectively having the delay NMOSs 13 and 33 whose gates are controlled by the control signal VN. Therefore, advantageous effects approximately similar to the first embodiment are obtained.

Modifications of Second Embodiment

The second embodiment is not limited to such a circuit configuration as shown in FIG. 4 and other usage forms and modifications are allowed. As the modifications thereof, for example, the following (i) through (iii) are known.

(i) The number of stages of the inverter circuits shown in FIG. 4 is not limited to five. At least one modified inverter may be provided.

(ii) The delay NMOSs 13 and 33 may be respectively provided between the output node and the NMOSs 12 and 32 without being provided between the NMOSs 12 and 32 and the VSS terminal.

(iii) In the correction circuit 70, the order in which the resistor 72 and the NMOS 71 are connected may be taken in reverse.

Third Preferred Embodiment

Figure 5:
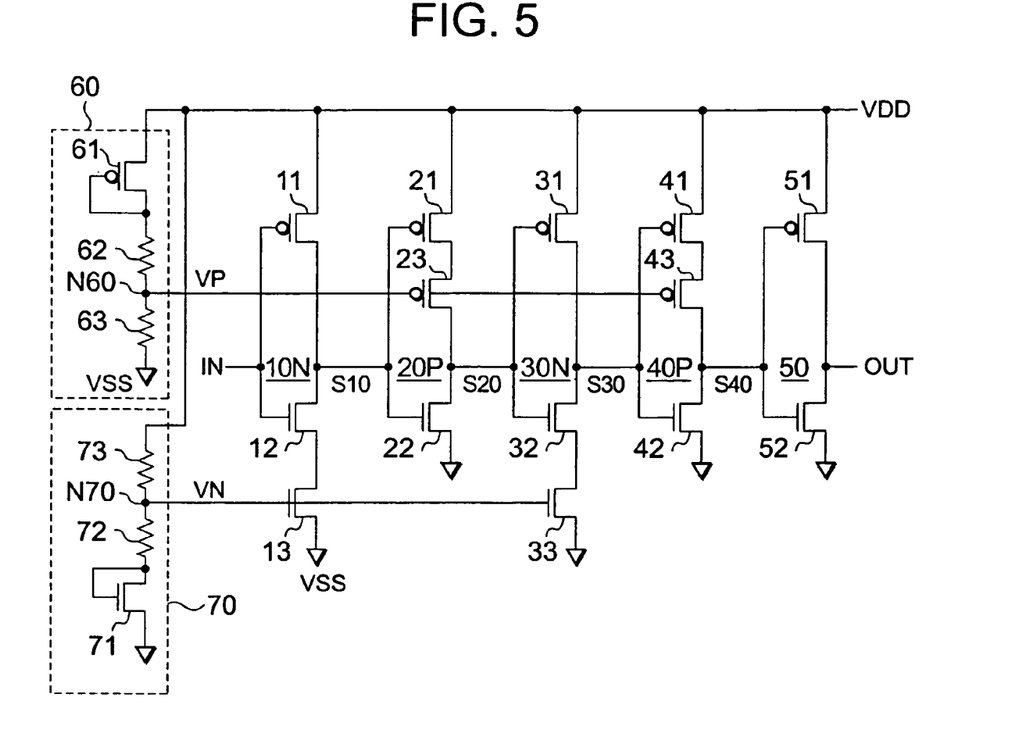
FIG. 5 is a circuit diagram of a delay circuit illustrating a third embodiment of the present invention.

FIG. 5 is a circuit diagram of a delay circuit showing a third embodiment of the present invention. Elements common to those shown in FIG. 1 illustrative of the first embodiment and FIG. 4 illustrative of the second embodiment are given common reference numerals.

The delay circuit shown in FIG. 5 is a circuit in which FIGS. 1 and 4 are combined together. The delay circuit comprises inverter circuits of five stages comprising modified inverters 10N, 20P, 30N and 40P corresponding to first, second, third and fourth stages and a normal CMOS type inverter 50 corresponding to a fifth stage, a correction circuit 60 which supplies a control signal VP to the modified inverters 20P and 40P, and a correction circuit 70 which supplies a control signal VN to the modified inverters 10N and 30N.

The operation of the delay circuit according to the third embodiment is equivalent to one obtained by combining the operations of the delay circuits of FIGS. 1 and 4 described in the first and second embodiments. The delay circuit brings about operative effects approximately similar to those obtained in the first and second embodiments. Since the delay circuit of the third embodiment is further provided with the four delay PMOSs 23 and 43 and NMOSs 13 and 33, a login delay time can be set.

Fourth Preferred Embodiment

Configuration of Fourth Embodiment

FIGS. 6(a) and 6(b) are circuit diagrams showing a fourth embodiment of the present invention, wherein the same figure (a) is a correction circuit 60A provided instead of the correction circuit 60 shown in FIG. 1 or 5, and the same figure (b) is a correction circuit 70A provided instead of the correction circuit 70 shown in FIG. 3 or 5. In these FIGS. 6(a) and 6(b), elements common to those in FIG. 1 showing the first embodiment and FIG. 4 showing the second embodiment are given common reference numerals.

The correction circuit 60A shown in FIG. 6(a) has a first conduction type fourth MOS transistor (e.g., PMOS) 61 diode-connected in the forward direction, a first resistor 62, an internal node N60A which outputs a control signal VP, second and third resistors 63a and 63b, and a first conduction type fifth MOS transistor (e.g., PMOS) 64. The source of the PMOS 61 is connected to a first power supply terminal (e.g., VDD terminal), and the gate and drain thereof are connected to one end of the first resistor 62. The other end of the first resistor 62 is connected to the internal node N60A. The internal node N60A is connected to a second power supply terminal (e.g., VSS terminal) via the second resistor 63a and the third resistor 63b. The source and drain of the PMOS 64 are parallel-connected to the second resistor 63a and the third resistor 63b, and the gate thereof is connected to a connecting point of the resistors 63a and 63b.

The correction circuit 70A shown in FIG. 6(b) has first and second resistors 73b and 73a, a second conduction type fourth MOS transistor (e.g., NMOS) 74, an internal node N70A which outputs a control signal VN, a third resistor 72, and a second conduction type fifth MOS transistor (e.g., NMOS) 71 diode-connected in the forward direction. The first and second resistors 73b and 73a connected in series between the first power supply terminal (e.g., VDD terminal) and the internal node N70A. The drain and source of the NMOS 74 are parallel-connected to the first and second resistors 73b and 73a, and the gate thereof is connected to a connecting point of the resistors 73b and 73a. One end of the third resistor 72 is connected to the internal node N70A, whereas the other end thereof is connected to the drain and gate of the NMOS 71. The source of the NMOS 71 is connected to its corresponding second power supply terminal (e.g., VSS terminal).

Operation of Fourth Embodiment

The operation of the correction circuit 60A shown in FIG. 6(a) will first be explained.

Assuming that the resistance values of the resistors 62, 63a and 63b are R62, R63a and R63b respectively, the current that flows through the resistor 62 is I62, the current that flows through the resistors 63a and 63b is I63, the current that flows through the PMOS 64 is I64, and the voltage at the connecting point of the resistors 63a and 63b is V63 in FIG. 6(a), the following equations are established:

$$VDD-Vtp-VP=R62 \times I62$$

$$I62=I63+I64$$

$$VP=(R63a+R63b) \times I63$$

$$V63=R63b \times I63$$

$$VP-V63=R63a \times I63$$

Solving these equations as simultaneous equations about the voltage of the control signal VP yields the following equation:

$$VP=(R63a+R63b)/(R62+R63a+R63b) \times (VDD-Vtp-R62 \times I64)$$

Thus, when the power supply voltage VDD rises, the voltage of the control signal VP also rises and the gate-to-source voltage Vgs of each delay PMOS is kept approximately constant. Hence, the drain current Ids can be rendered constant. When the power supply voltage VDD is lowered, the gate voltage of each delay PMOS is also reduced so that the drain current Ids is kept constant. It is thus possible to suppress a variation in delay time with respect to a variation in the power supply voltage VDD. Since the voltage of the control signal VP moves in the direction to cancel it with respect to a variation in threshold voltage Vtp, the influence of a process variation can be suppressed.

Further, in the PMOS 64 of the correction circuit 60A, the following equation is established:

$$Vds(=VP)>Vgs(=VP-V63)-Vtp$$

where Vds: drain-to-source voltage of PMOS 64
Vgs: gate-to-source voltage of PMOS 64

Since the PMOS 64 is operated in a saturation characteristic region, the following equation is established:

$$I64 = \beta/2 \times (VP - V63 - Vtp)^2$$
$$= \beta/2 \times (I63 \times R63a - Vtp)^2$$
$$= \beta/2 \times \{VP \times R63a/(R63a + R63b) - Vtp\}^2$$

where β=W/L×μCox
W: gate width of PMOS 64
L: gate length of PMOS 64

Solving the above equation about the voltage of the control signal VP yields the following equation:

$$VP = (R63a+R63b)/R63a \times (\sqrt{(2 \times I64/\beta)} + Vtp)$$

Thus, the value of β may be set large in order to enhance the influence of the threshold voltage Vtp and reduce the influence of the current I64. Since β is proportional to the gate width W, there is known a method of setting the gate width W large, for example. When the threshold voltage Vtp decreases with a rise in temperature, the voltage of the control signal VP is also lowered and the gate voltage of each delay PMOS is also reduced. Thus, the drain current Ids of each delay PMOS is kept constant. When the threshold voltage Vtp rises with a drop in temperature, the voltage of the control signal VP also rises and the gate voltage of each delay PMOS also rises, so that the drain current Ids is kept constant.

The operation of the correction circuit 70A shown in FIG. 6(*b*) will next be explained.

Figure 6:
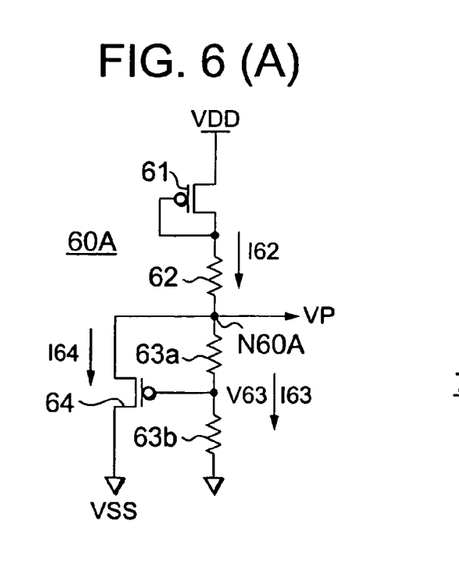
FIGS. 6(A) and 6(B) are circuit diagrams of a delay circuit depicting a fourth embodiment of the present invention.

Assuming that in FIG. 6(*b*), the resistance values of the resistors 72, 73*a* and 73*b* are R72, R73*a* and R73*b* respectively, the current that flows through the resistor 72 is I72, the current that flows through the resistors 73*a* and 73*b* is I73, the current that flows through the NMOS 74 is I74, and the voltage at the connecting point of the resistors 73*a* and 73*b* is V73, the following equations are established:

$$VN - Vtn = R72 \times I72$$

$$I72 = I73 + I74$$

$$VDD - VN = (R73a + R73b) \times I73$$

$$VDD - V73 = R73b \times I73$$

$$V73 - VN = R73a \times I73$$

Solving these equations as simultaneous equations about the voltage of the control signal VN yields the following equation:

$$VN = R72/(R72+R73a+R73b) \times VDD +$$
$$(R73a+R73b)/(R72+R73a+R73b) \times Vtn +$$
$$R72 \times (R73a+R73b)/(R72+R73a+R73b) \times I74$$

Thus, the resistance value R72 is set small and the resistance value (R73*a*+R73*b*) is set large to enable the influence of a variation in power supply voltage VDD to be reduced. Since the voltage of the control signal VN moves in the direction to cancel it with respect to a variation in threshold voltage Vtn, the influence of a process variation can be suppressed.

Further, in the NMOS 74 of the correction circuit 70A, the following equation is established:

$$Vds(=VDD-VN) > Vgs(=V73-VN) - Vtn$$

Since the NMOS 74 is operated in a saturation characteristic region, the following equation is established:

$$I74 = \beta/2 \times (V73 - VN - Vtn)^2$$
$$= \beta/2 \times (I73 \times R73a - Vtn)^2$$
$$= \beta/2 \times \{(VDD - VN) \times R73a/(R73a + R73b) - Vtn\}^2$$

Solving the above equation about the voltage of the control signal VN yields the following equation:

$$VN = VDD - (R73a+R73b)/R73a \times (\sqrt{(2 \times I74/\beta)} + Vtn)$$

Thus, the value of β may be set large in order to enhance the influence of the threshold voltage Vtn and reduce the influence of the current I74. When the threshold voltage Vtn decreases with a rise in temperature, the voltage of the control signal VN rises and the gate voltage of each delay NMOS also rises. Thus, the drain current Ids thereof is kept constant. When the threshold voltage Vtn rises with a drop in temperature, the voltage of the control signal VN also drops and the gate voltage of each delay NMOS is also lowered, so that the drain current Ids is kept constant.

Effects of Fourth Embodiment

Figure 7:
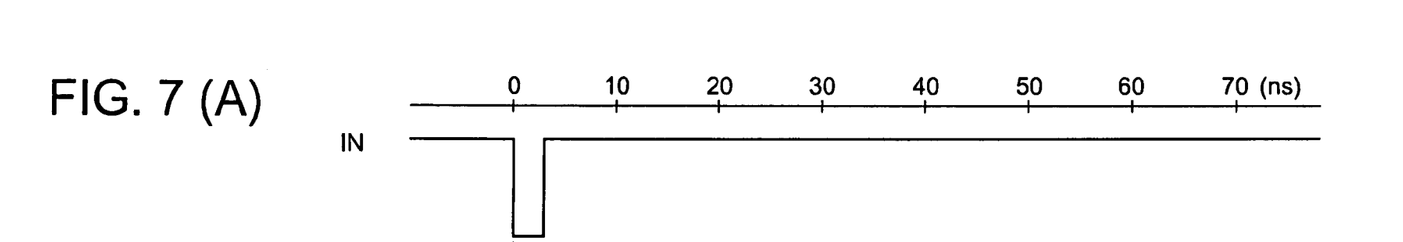

FIGS. 7(*a*) through 7(*d*) are waveform diagrams showing simulation results of the fourth embodiment of the present invention. Simulation waveforms shown in FIG. 7 are ones obtained where the correction circuits 60A and 70A shown in FIG. 6 are used as the correction circuits in the delay circuit shown in FIG. 5. FIG. 7(*a*) shows the waveform of an input signal IN, FIG. 7(*b*) illustrates the waveforms of output signals OUT at an ambient temperature of −10° C., which are obtained where a power supply voltage VDD is given as four types of 3.6V, 3.3V, 3.0V and 2.7V. Incidentally, simulation results obtained where the correction circuits 1 and 2 in the conventional delay circuit shown in FIG. 2 are used as the correction circuits in the delay circuit shown in FIG. 5 are shown by broken lines in FIG. 7(*b*) for comparison. Similar simulation results obtained where the ambient temperatures are respectively set as 25° C. and 80° C. are shown in FIGS. 7(*c*) and 7(*d*) respectively.

As is apparent from the simulation results, it is understood that although compensation for the variation in temperature is performed relatively satisfactorily in the delay circuit using the conventional correction circuits 1 and 2 shown in FIG. 2, the delay time greatly varies when the power supply voltage VDD varies, and the compensation for the variation in power supply voltage VDD is not carried out. On the other hand, it is apparent that the delay time remains almost unchanged regardless of the ambient temperature and the power supply voltage in the delay circuit using the correction circuits 60A and 70A according to the fourth embodiment.

Modifications of Fourth Embodiment

The fourth embodiment is not limited to the circuit configuration shown in FIG. 6. Other usage forms and modifications can be adopted. As the modifications thereof, for instance, the following (i) and (ii) are known.

(i) The order in which the PMOS 61 and resistor 62 in the correction circuit 60A are connected may be set in reverse. That is, the resistor 62 may be provided on the VDD terminal side. Likewise, the order in which the NMOS 71 and resistor 72 in the correction circuit 70A are connected may be set in reverse. Even when such a configuration is taken, operative effects substantially similar to those of the fourth embodiment can be obtained.

(ii) The PMOS 61 employed in the correction circuit 60A and the NMOS 71 employed in the correction circuit 70A may be deleted. While an effect against a variation in power supply voltage VDD is reduced where such a configuration is set, effects against a variation in ambient temperature and a process variation can be sufficiently obtained.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A delay circuit comprising:
    modified inverters each having first and second MOS transistors of first conduction type connected in series between a first power supply terminal to which a first power supply voltage is applied and an output node, and a third MOS transistor of second conduction type connected between the output node and a second power supply terminal to which a second power supply voltage is applied, said first and third MOS transistors each having a gate electrode connected to an input node and said second MOS transistor having a gate electrode supplied with a control signal for delay control; and
    a correction circuit having a fourth MOS transistor of said first conduction type and a first resistor connected in series between the first power supply terminal and an internal node used for outputting the control signal, second and third resistors connected in series between the internal node and the second power supply terminal, and a fifth MOS transistor of said first conduction type connected in parallel with the second and third resistors, said fourth MOS transistor being diode-connected in a forward direction and said fifth MOS transistor having a gate electrode connected to a connecting point of the second and third resistors.

2. The delay circuit according to claim 1, wherein said first conduction type is a P channel type and said second conduction type is an N channel type.

3. The delay circuit according to claim 1, wherein the first power supply voltage is a voltage higher than the second power supply voltage, and the second power supply voltage is a ground voltage.

4. A delay circuit comprising:
    modified inverters each having a first MOS transistor of first conduction type connected between a first power supply terminal to which a first power supply voltage is applied and an output node, and second and third MOS transistors of second conduction type connected in series between the output node and a second power supply terminal to which a second power supply voltage is applied, said first and second MOS transistors each having a gate electrode connected to an input node and said third MOS transistor having a gate electrode supplied with a control signal for delay control; and
    a correction circuit having first and second resistors connected in series between the first power supply terminal and an internal node used to output the control signal, a fourth MOS transistor of said second conduction type parallel-connected to the first and second resistors and having a gate electrode connected to a connecting point of the first and second resistors, and a third resistor connected between the internal node and the second power supply terminal.

5. The delay circuit according to claim 4, wherein said first conduction type is a P channel type and said second conduction type is an N channel type.

6. The delay circuit according to claim 4, wherein the first power supply voltage is a voltage higher than the second power supply voltage, and the second power supply voltage is a ground voltage.

7. A delay circuit comprising:
    modified inverters each having a first MOS transistor of first conduction type connected between a first power supply terminal to which a first power supply voltage is applied and an output node, and second and third MOS transistors of second conduction type connected in series between the output node and a second power supply terminal to which a second power supply voltage is applied, said first and second MOS transistors each having a gate electrode connected to an input node and said third MOS transistor having a gate electrode supplied with a control signal for delay control; and
    a correction circuit having first and second resistors connected in series between the first power supply terminal and an internal node used for outputting the control signal, a fourth MOS transistor of said second conduction type connected in parallel with the first and second resistors, and a third resistor and a fifth MOS transistor of said second conduction type connected in series between the internal node and the second power supply terminal, said fourth MOS transistor having a gate electrode connected to a connecting point of the first and second resistors, and said fifth MOS transistor being diode-connected in a forward direction.

8. The delay circuit according to claim 7, wherein said first conduction type is a P channel type and said second conduction type is an N channel type.

9. The delay circuit according to claim 7, wherein the first power supply voltage is a voltage higher than the second power supply voltage, and the second power supply voltage is a ground voltage.

* * * * *